(12) United States Patent
Howard et al.

(10) Patent No.: US 9,984,888 B2
(45) Date of Patent: May 29, 2018

(54) METHOD OF FABRICATING A SEMICONDUCTOR WAFER INCLUDING A THROUGH SUBSTRATE VIA (TSV) AND A STEPPED SUPPORT RING ON A BACK SIDE OF THE WAFER

(71) Applicant: Newport Fab, LLC, Newport Beach, CA (US)

(72) Inventors: David J. Howard, Irvine, CA (US); Hadi Jebory, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days. days.

(21) Appl. No.: 14/794,032

(22) Filed: Jul. 8, 2015

(65) Prior Publication Data

US 2016/0049355 A1 Feb. 18, 2016

Related U.S. Application Data

(60) Provisional application No. 62/036,771, filed on Aug. 13, 2014.

(51) Int. Cl.
*H01L 23/498* (2006.01)
*H01L 21/304* (2006.01)
(Continued)

(52) U.S. Cl.
CPC .......... *H01L 21/304* (2013.01); *H01L 21/486* (2013.01); *H01L 21/76898* (2013.01); *H01L 22/26* (2013.01); *H01L 23/49827* (2013.01); *H01L 23/564* (2013.01); *H01L 2924/0002* (2013.01)

(58) Field of Classification Search
CPC . H01L 21/304; H01L 23/562; H01L 21/6835; H01L 24/94; H01L 21/486; H01L 21/76898; H01L 23/481; H01L 23/5385; H01L 23/5384

See application file for complete search history.

(56) References Cited

U.S. PATENT DOCUMENTS 8,263,497 B2 * 9/2012 Andry ............... H01L 21/76898
438/459
8,292,690 B2 * 10/2012 Seddon ............. H01L 21/02035
451/5

(Continued)

*Primary Examiner* — Benjamin Sandvik
(74) *Attorney, Agent, or Firm* — Bever, Hoffman & Harms, LLP (57) ABSTRACT

A semiconductor wafer having a plurality of through substrate vias (TSVs) is disclosed. The semiconductor wafer includes a stepped support ring on an outer edge of the semiconductor wafer, a usable back side region of the semiconductor wafer substantially enclosed by the stepped support ring, and the plurality of TSVs extending from a front side of the semiconductor wafer to the usable back side region of the semiconductor wafer. The stepped support ring includes a step between an outer ring and an inner ring of the stepped support ring. The semiconductor wafer further includes a back side metal on the usable back side region of the semiconductor wafer, a plurality of semiconductor devices on the front side of the semiconductor wafer, where at least one of the plurality of semiconductor devices is coupled to the back side metal through at least one of the plurality of TSVs.

11 Claims, 4 Drawing Sheets

(51) Int. Cl.
*H01L 23/00* (2006.01)
*H01L 21/66* (2006.01)
*H01L 21/768* (2006.01)
*H01L 21/48* (2006.01)

(56) References Cited

U.S. PATENT DOCUMENTS

| | | | | |
|---|---|---|---|---|
| 8,790,995 | B2* | 7/2014 | Takyu | H01L 21/304 |
| | | | | 257/E21.238 |
| 8,900,996 | B2* | 12/2014 | Chen | H01L 21/76898 |
| | | | | 257/182 |
| 9,076,699 | B2* | 7/2015 | Zhang | H01L 24/11 |
| 9,786,509 | B2* | 10/2017 | Nishihara | H01L 21/304 |
| 2009/0186563 | A1* | 7/2009 | Takahashi | B24B 7/228 |
| | | | | 451/57 |
| 2010/0187557 | A1* | 7/2010 | Samoilov | H01L 27/144 |
| | | | | 257/99 |
| 2014/0113526 | A1* | 4/2014 | Kipper | H01L 21/6835 |
| | | | | 451/5 |

\* cited by examiner

US 9,984,888 B2

METHOD OF FABRICATING A SEMICONDUCTOR WAFER INCLUDING A THROUGH SUBSTRATE VIA (TSV) AND A STEPPED SUPPORT RING ON A BACK SIDE OF THE WAFER

The present application claims the benefit of and priority to a provisional patent application entitled "Thinned Processed Wafer Having Devices and Vias and Method for Formation," Ser. No. 62/036,771 filed on Aug. 13, 2014. The disclosure in this provisional application is hereby incorporated fully by reference into the present application.

BACKGROUND

Semiconductor devices, such as complementary-metal-oxide semiconductor (CMOS) devices, complementary bipolar CMOS (BiCMOS) devices, bipolar junction transistors (BJTs) and field effect transistors (FETs), and micro-electromechanical systems (MEMS) devices, that are fabricated on a front side of a semiconductor wafer, usually require conductive structures, such as through substrate vias (TSVs), to provide electrical connection to a back side of the semiconductor wafer. The connection to the TSVs from the back side of the semiconductor wafer can be made by grinding the back side using wafer thinning, polish or grinding equipment with an intention of grinding into the TSVs.

According to a conventional wafer thinning approach, a semiconductor wafer is temporarily bonded to a handle wafer using bonding material, such as polymeric material, which requires low temperature processing, for example, under 250-300° C. The semiconductor wafer is ground using standard grinding equipment, which grinds the entire diameter of the semiconductor wafer, thereby reducing the overall thickness across the semiconductor wafer. After the grinding action, a polish action, such as Chemical Mechanical Polishing (CMP), wet etch or plasma etch, is required to polish and remove residues from the back side surface. In the conventional approach, the thinned semiconductor wafer needs to be debonded from the handle wafer. The bonding material tends to outgas at 200-300° C., thereby limiting high temperature wafer processing. Also, grinding into metallic filler material in the vias within the semiconductor wafer can lead to destruction of the grinding wheel and cause subsurface damage or even destruction of the semiconductor wafer. In addition, the final polish action, such as CMP, wet etch or plasma etch, can cause further stress to the thinned semiconductor wafer, which can lead to cracking of the semiconductor wafer rendering dies on the semiconductor wafer unsuitable for further processing. As a result, reducing the depth of the TSVs in thin semiconductor wafers presents difficulties. The conventional wafer thinning approach cannot produce shallow TSVs of 300 µm or less.

As semiconductor dies used in electronic products continue to shrink in size, there is a need in the art for high volume manufacturing of thinned processed semiconductor wafers having devices and TSVs, for example, in 150 µm or less thickness range, without causing cracking or subsurface damage to the semiconductor wafers.

SUMMARY

The present disclosure is directed to thinned processed wafer having devices and vias and related method, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
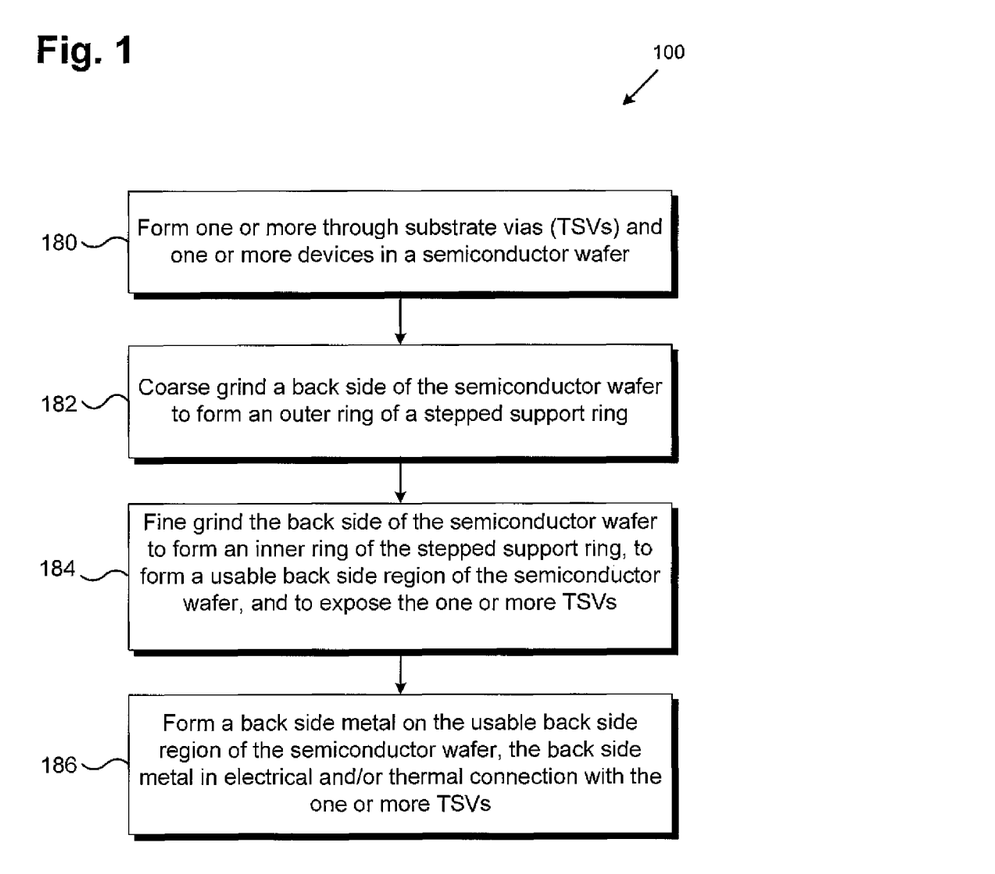
FIG. 1 is a flowchart illustrating a method of forming a semiconductor wafer having one or more through substrate vias (TSVs) according to one implementation of the present application.

FIG. 1 shows a flowchart illustrating an exemplary method of forming a semiconductor wafer having one or more TSVs according to an implementation of the present inventive concepts. Certain details and features have been left out of flowchart 100 that are apparent to a person of ordinary skill in the art. For example, an action may consist of one or more subactions or may involve specialized equipment or materials, as known in the art. Actions 180 through 186 indicated in flowchart 100 are sufficient to describe one implementation of the present inventive concepts, other implementations of the present inventive concepts may utilize actions different from those shown in flowchart 100. Moreover, structures 280, 282, 284 and 286 in FIGS. 2A, 2B, 2C and 2D illustrate the results of performing actions 180, 182, 184 and 186 of flowchart 100, respectively. For example, structure 280 is an exemplary structure of a portion of a semiconductor wafer after processing action 180, structure 282 is an exemplary structure after the processing of action 182, structure 284 is an exemplary structure after the processing of action 184, and so forth.

Figure 2A:
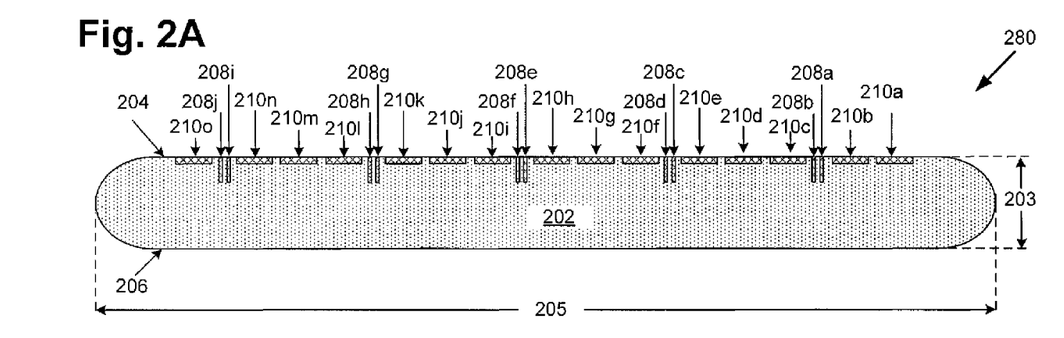
FIG. 2A illustrates a cross-sectional view of a semiconductor wafer having one or more TSVs processed in accordance with an initial action in the flowchart of FIG. 1 according to one implementation of the present application.

Referring to action 180 in FIG. 1 and structure 280 in FIG. 2A, action 180 of flowchart 100 includes forming one or more TSVs and one or more devices on a front side of a semiconductor wafer. As illustrated in FIG. 2A, structure 280 includes semiconductor wafer 202, TSVs 208*a*, 208*b*, 208*c*, 208*d*, 208*e*, 208*f*, 208*g*, 208*h*, 208*i* and 208*j* (hereinafter collectively referred to as "TSVs 208*a* through 208*j*"), and devices 210*a*, 210*b*, 210*c*, 210*d*, 210*e*, 210*f*, 210*g*, 210*h*, 210*i*, 210*j*, 210*k*, 210*l*, 210*m*, 210*n* and 210*o* (hereinafter collectively referred to as "devices 210*a* through 210*o*"), after completion of action 180 of flowchart 100 in FIG. 1.

As illustrated in FIG. 2A, semiconductor wafer 202 includes front side 204 and back side 206. In an implementation of the present application, semiconductor wafer 202 may be a group IV wafer, such as silicon, silicon germanium, germanium, or the like. In another implementation, semiconductor wafer 202 may include interlayer dielectric layers and interconnect metal layers (not explicitly shown in FIG. 2A). TSVs 208*a* through 208*j* are formed on front side 204 of semiconductor wafer 202. For example, TSVs 208*a* through 208*j* may be formed by depositing and patterning a hard mask on front side 204 of semiconductor wafer 202, etching front side 204 to form one or more vias or trenches in semiconductor wafer 202, and filling the one or more vias or trenches with a metallic filler. In the present implementation, the metallic filler of TSVs 208*a* through 208*j* includes tungsten, since tungsten is more closely matched to silicon with respect to coefficients of thermal expansion (CTE) than other suitable metallic filler material. In other implementations, the metallic filler of TSVs 208*a* through 208*j* may include other suitable electrically and/or thermally conductive material, such as copper and/or titanium.

As illustrated in FIG. 2A, structure 280 further includes devices 210*a* through 210*o* formed on front side 204 of semiconductor wafer 202. In one implementation, one or more devices 210*a* through 210*o* may include active semiconductor devices, such as CMOS devices, BiCMOS devices, BJTs and FETs. In another implementation, one or more devices 210*a* through 210*o* may include passive devices, such as resistors, capacitors and inductors. In yet another implementation, one or more devices 210*a* through 210*o* may include MEMS devices or any combination of MEMS devices, active semiconductor devices and passive devices.

In the present implementation, semiconductor wafer 202 has thickness 203 of approximately 725 μm. However, thickness 203 of semiconductor wafer 202 is not so limited and may have a thickness outside this range, according to the requirements of a particular application. Also, in the present implementation, semiconductor wafer 202 has diameter 205 of approximately 200 mm. However, diameter 205 of semiconductor wafer 202 is not so limited and may have a diameter outside this range, according to the requirements of a particular application.

Figure 2B:
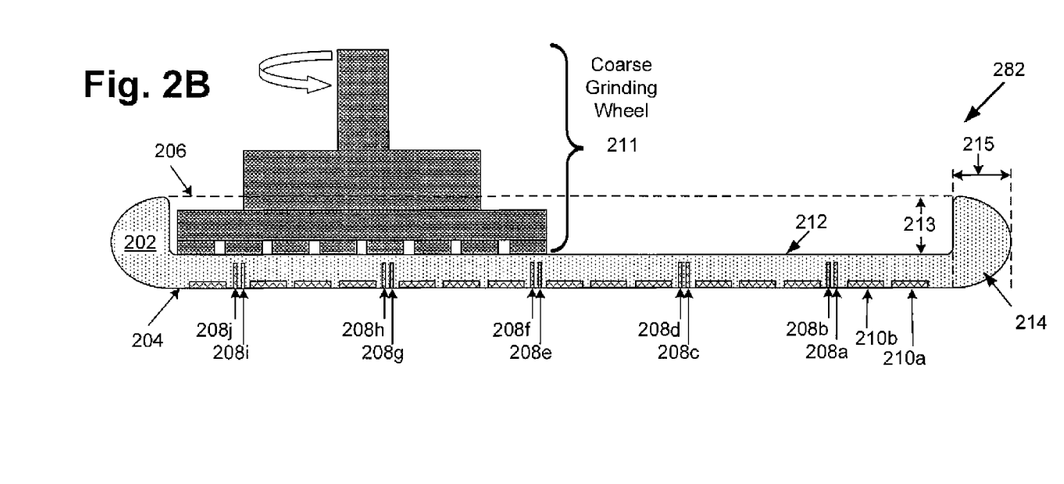
FIG. 2B illustrates a cross-sectional view of a portion of a semiconductor wafer having one or more TSVs processed in accordance with an intermediate action in the flowchart of FIG. 1 according to one implementation of the present application.

Referring to action 182 in FIG. 1 and structure 282 in FIG. 2B, action 182 of flowchart 100 includes coarse grinding a back side of a semiconductor wafer, for example, by using a coarse grinding wheel to form an outer ring of a stepped support ring. As illustrated in FIG. 2B, structure 282 includes semiconductor wafer 202, TSVs 208*a* through 208*j*, devices 210*a* through 210*o*, and outer ring 214 on an outer edge of semiconductor wafer 202, after completion of action 182 of flowchart 100 in FIG. 1.

As illustrated in FIG. 2B, in structure 282, semiconductor wafer 202 in structure 280 is flipped upside down, such that front side 204, having TSVs 208*a* through 208*j* and devices 210*a* through 210*o*, is now at the bottom. In turn, back side 206 is facing up for back side processing. It is noted that only devices 210*a* and 210*b* of devices 210*a* through 210*o* are labeled in FIGS. 2B-2D, to preserve visual clarity. During the back side wafer processing and subsequent processing actions, a protective coating layer (not explicitly shown in FIGS. 2B-2D), can be applied to front side 204 to protect the front side wafer surface, TSVs 208*a* through 208*j* and devices 210*a* through 210*o*. The protective coating layer may include a thick resist, such as polymethylmethacrylate (PMMA) or polymethylglutarimide (PMGI), or polyimide, which may be formed by spin coating and baking, for example.

As illustrated in FIG. 2B, coarse grinding wheel 211 is utilized to coarse grind and remove a portion of semiconductor wafer 202 from back side 206. For example, the coarse grind terminates on first interior surface 212 of semiconductor wafer 202 at depth 213 below back side 206. In the present implementation, depth 213 is approximately 600-615 μm. However, depth 213 is not so limited and may have a depth outside this range, according to the requirements of a particular application.

As further illustrated in FIG. 2B, it is important to note that the coarse grinding of back side 206 in action 182 terminates on first interior surface 212 before reaching TSVs 208*a* through 208*j*. It is also important to note that the coarse grinding of back side 206 in action 182 does not grind the entire diameter of semiconductor wafer 202 from back side 206. Instead, it leaves outer ring 214 on the outer edge of semiconductor wafer 202. As such, at least a portion of outer ring 214 retains full thickness 203 of semiconductor wafer 202, as outer ring 214 is rounded toward the outer edge of semiconductor wafer 202.

In the present implementation, width 215 of outer ring 214 is approximately 2-3.5 mm. However, width 215 of outer ring 214 is not so limited and may have a width outside this range, according to the requirements of a particular application. For example, in one implementation, it may be desirable to make width 215 as small as possible to maximize a usable back side region of semiconductor wafer 202, while maintaining the structural integrity of semiconductor wafer 202.

In contrast to conventional wafer thinning methods, in which the entire backside of a semiconductor wafer is ground to create a "knife edge" around the semiconductor wafer, the formation of outer ring 214 having round edge can advantageously avoid edge chipping during wafer thinning and during any subsequent processing actions. Also, after performing action 182 of flowchart 100, since outer ring 214 forms a rigid frame structure on the outer edge of semiconductor wafer 202 to provide mechanical strength to maintain the structural integrity of structure 282, structure 282 can be picked up and moved around by hand without using any special wafer handling and/or supporting tools.

Figure 2C:
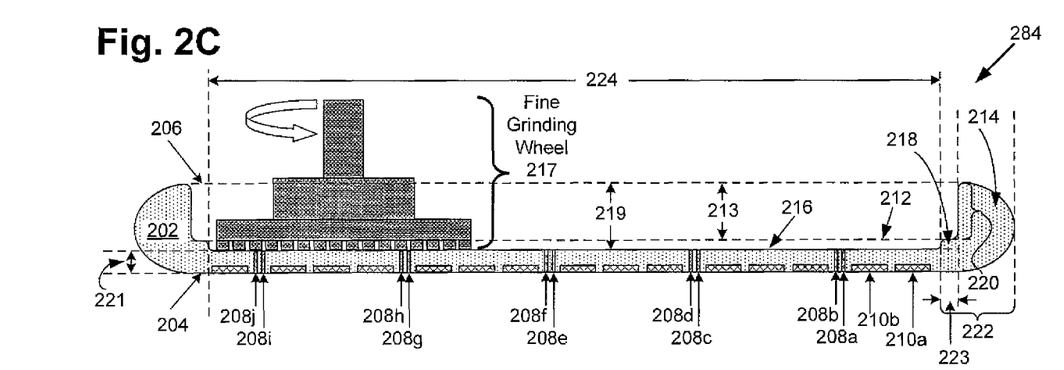
FIG. 2C illustrates a cross-sectional view of a semiconductor wafer having one or more TSVs processed in accordance with an intermediate action in the flowchart of FIG. 1 according to one implementation of the present application.

Referring to action 184 in FIG. 1 and structure 284 in FIG. 2C, action 184 of flowchart 100 includes fine grinding a back side of a semiconductor wafer, for example, by using a fine grinding wheel to form an inner ring of a stepped support ring, and to form a usable back side region of the semiconductor wafer substantially enclosed by the stepped support ring. Moreover, the fine grinding of the back side of the semiconductor wafer in action 184 also exposes one or more TSVs in the semiconductor wafer. As illustrated in FIG. 2C, structure 284 includes semiconductor wafer 202, TSVs 208a through 208j, devices 210a through 210o, outer ring 214, inner ring 218 and usable back side region 224 on back side 206 of semiconductor wafer 202, after completion of action 184 of flowchart 100 in FIG. 1.

As illustrated in FIG. 2C, in structure 284, semiconductor wafer 202 undergoes a fine grind on back side 206 of semiconductor wafer 202 to form inner ring 218 and usable back side region 224. For example, fine grinding wheel 217 is utilized to fine grind and remove another portion of semiconductor wafer 202 from back side 206. As illustrated in FIG. 2C, the fine grind in action 184 terminates on second interior surface 216 of semiconductor wafer 202 at depth 219 below back side 206. In the present implementation, depth 219 is approximately 625-675 μm. However, depth 219 is not so limited and may have a depth outside this range, according to the requirements of a particular application.

In the present implementation, the fine grind of action 184 of flowchart 100 also forms usable back side region 224 from which semiconductor dies can be fabricated. Usable back side region 224 of semiconductor wafer 202 has thickness 221. In the present implementation, thickness 221 of usable back side region 224 is a substantially uniform thickness of approximately 100 μm. In another implementation, thickness 221 of usable back side region 224 may be a substantially uniform thickness of approximately 50-150 μm. However, thickness 221 of usable back side region 224 is not so limited and may have a thickness outside this range, according to the requirements of a particular application. Since thickness 221 of usable back side region 224 is in the 50-150 μm range, for example, it is important that TSVs 208a through 208j and devices 210a through 210o are formed on front side 204 of semiconductor wafer 202 before the back side processing, such as before action 182 of flowchart 100.

As illustrated in FIG. 2C, the fine grind does not grind the entire diameter of outer ring 214. Instead, it forms inner ring 218 between usable back side region 224 and outer ring 214. Thus, inner ring 218 and outer ring 214 together form stepped support ring 222, where stepped support ring 222 includes step 220 between inner ring 218 and outer ring 214. As further illustrated in FIG. 2C, stepped support ring 222 substantially encloses usable back side region 224. Inner ring 218 is configured to further provide mechanical strength to maintain the structural integrity of structure 284 as semiconductor wafer 202 undergoes the fine grind in action 184 of flowchart 100. In the present implementation, width 223 of inner ring 218 is a substantially uniform width of approximately 1 mm. However, width 223 of inner ring 218 is not so limited and may have a width outside this range, according to the requirements of a particular application. For example, in one implementation, it may be desirable to make width 223 as small as possible to maximize usable back side region 224, while maintaining the structural integrity of semiconductor wafer 202.

As mentioned above, after the fine grind of action 184, usable back side region 224 of semiconductor wafer 202 is thinned to thickness 221 of approximately 50-150 μm, for example. Inner ring 218 provides a transition necessary to reduce the stress concentrated at the boundary between usable back side region 224 and outer ring 214 to avoid wafer cracking during the fine grind of action 184. Without inner ring 218 providing the transition between usable back side region 224 and outer ring 214, one or more sharp edges would have been resulted between outer ring 214 and usable back side region 224. The fine grinding would introduce additional stress to the semiconductor wafer at the sharp edges, which can lead to cracking of the semiconductor wafer.

During the fine grind in action 184 of flowchart 100, it may be desirable to form second interior surface 216 with a desired amount of roughness or friction for a deposition of a back side metal in a subsequent action. In order to accomplish the desired amount of roughness on second interior surface 216, in one implementation of the present application, fine grinding wheel 217 includes a finer wheel as compared to coarse grinding wheel 211 shown in FIG. 2B. In addition, fine grinding wheel 217 may operate at a grinding rate equal to or different from that of coarse grinding wheel 211. Moreover, an automatic feedback may be implemented in fine grinding wheel 217, such that fine grinding wheel 217 may sense a change in grinding rate when it reaches one or more TSVs 208a through 208j during the fine grind in action 184.

Upon sensing a change in grinding rate, fine grinding wheel 217 is configured to stop grinding after a predetermined time, such that the fine grind in action 184 removes the least amount of metallic filler in one or more TSVs 208a through 208j. As a result of the automatic feedback, the fine grind in action 184 can advantageously minimize the surface and/or subsurface damage to second interior surface 216. Also, by implementing the automatic feedback during the fine grind in action 184, second interior surface 216 can have the desired amount of roughness to improve adhesion between second interior surface 216 and a back side metal to be subsequently deposited thereon. In addition, the ability to sense a change in grinding rate can minimize damage to and avoid destruction of the grinding wheel, which would otherwise result from the friction between the metallic filler in the TSVs and the grinding wheel, thus prolonging the lifetime of the grinding wheel.

Without the ability to sense a change in grinding rate, a grinding wheel would grind into and remove, for example, the metallic filler in one or more TSVs. The metallic filler, such as tungsten, can be a hard material as compared to the material in the surrounding semiconductor wafer. The metallic filler broken off from the one or more TSVs would ramble across the wafer surface as the grinding wheel continues to grind down the wafer. This would result in substantial surface and subsurface damage to the wafer, and would also lead to cracking of the wafer. Furthermore, without the ability to sense a change in grinding rate, conventional grinding methods require a polish action, such as CMP, wet etch and plasma etch, to polish the damaged wafer surface and remove residues from the wafer surface after the grinding action. The polish action can further introduce stress to the semiconductor wafer, in addition to the surface/subsurface damage done to the semiconductor wafer during the grinding action, which can lead to destruction of the entire semiconductor wafer.

As a result of the automatic feedback during the fine grind in action 184, fine grinding of semiconductor wafer 202 may automatically terminate after sensing a change in grinding rate upon reaching one or more TSVs 208a through 208j to minimize damage to second interior surface 216. As such, the polishing action required by conventional wafer thinning approaches can be advantageously avoided.

Figure 2D:
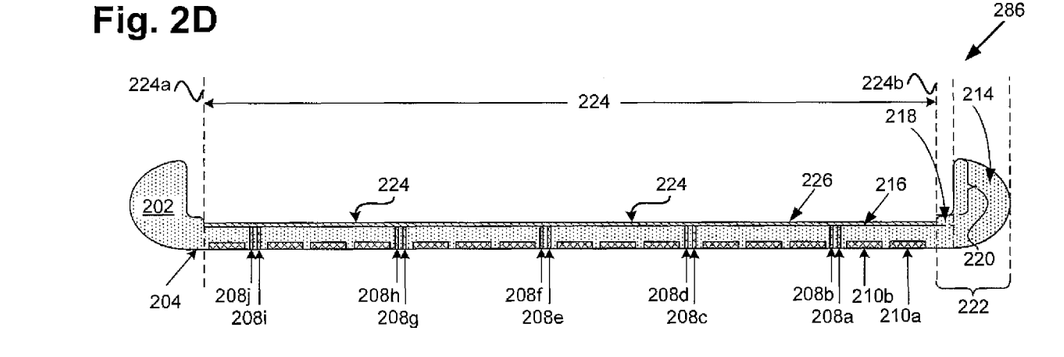
FIG. 2D illustrates a cross-sectional view of a semiconductor wafer having one or more TSVs processed in accordance with a final action in the flowchart of FIG. 1 according to one implementation of the present application.

Referring to action 186 in FIG. 1 and structure 286 in FIG. 2D, action 186 includes forming a back side metal on a usable back side region of a semiconductor wafer, where the back side metal is in electrical and/or thermal connection with one or more TSVs. As illustrated in FIG. 2D, structure 286 includes semiconductor wafer 202, TSVs 208a through 208*j*, devices 210*a* through 210*o*, outer ring 214, inner ring 218 and back side metal 226 on usable back side region 224 of semiconductor wafer 202, after completion of action 186 of flowchart 100 in FIG. 1.

As illustrated in FIG. 2D, in structure 286, back side metal 226 is formed on usable back side region 224 of semiconductor wafer 202. Back side metal 226 may be formed by using the same material as the material used for the metallic filler of TSVs 208*a* through 208*j*. In the present implementation, back side metal 226 includes tungsten, as tungsten is more closely matched to silicon with respect to coefficients of thermal expansion (CTE) than other suitable materials. In another implementation, back side metal 226 may include other metallic material, such as copper, titanium, or any other suitable electrically and/or thermally conductive material. One or more TSVs 208*a* through 208*j* can be utilized to provide electrical and/or thermal connections between one or more devices 210*a* through 210*o* and back side metal 226 in any desired manner. In the present implementation, one or more TSVs 208*a*-208*j* are electrically connected to back side metal 226, which may be a ground plate for semiconductor wafer 202. In another implementation, one or more TSVs 208*a*-208*j* may be through-silicon vias. In yet another implementation, one or more TSVs 208*a*-208*j* may be isolated TSVs. As discussed above with FIGS. 1 and 2A through 2D, implementations of the present inventive concepts can achieve a thinned processed wafer with one or more TSVs that extends through the thinned processed wafer having a thickness of approximately 50-150 μm.

Figure 3A:
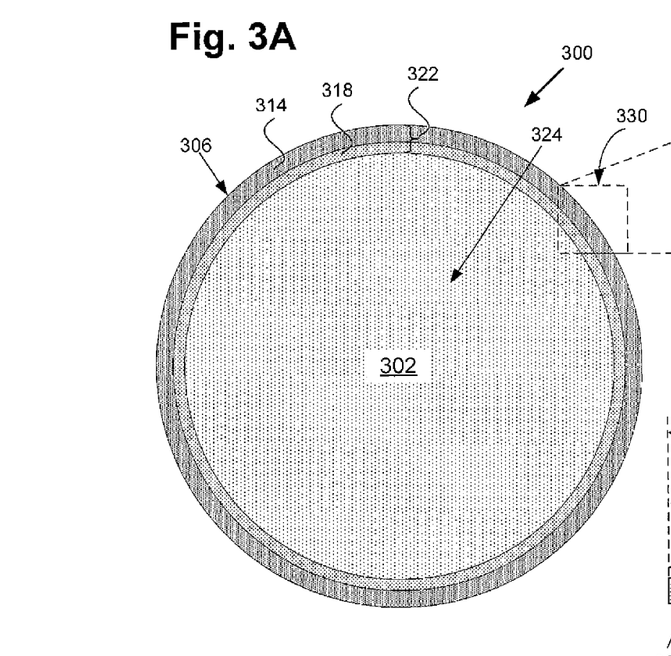
FIG. 3A illustrates a top plan view of a semiconductor wafer having one or more TSVs according to one implementation of the present application.

FIG. 3A presents a top plan view of an exemplary semiconductor wafer, according to an implementation of the present application. In particular, exemplary structure 300 of FIG. 3A shows a top plan view of back side 306 of semiconductor wafer 302 having stepped support ring 322. Semiconductor wafer 302 includes front side 304 (not explicitly shown in FIG. 3A) and back side 306. As illustrated in FIG. 3A, on back side 306 of semiconductor wafer 302, usable back side region 324 is substantially enclosed by stepped support ring 322. Stepped support ring 322 includes outer ring 314 and inner ring 318. Semiconductor wafer 302 also includes a plurality of TSVs, semiconductor devices and other circuit elements on front side 304 of semiconductor wafer 302 (not explicitly shown in FIG. 3A). In an implementation of the present application, semiconductor wafer 302 may be a group IV wafer, such as silicon, silicon germanium, germanium, or the like. In another implementation, semiconductor wafer 302 may include interlayer dielectric layers and interconnect metal layers (not explicitly shown in FIG. 3A).

Figure 3B:
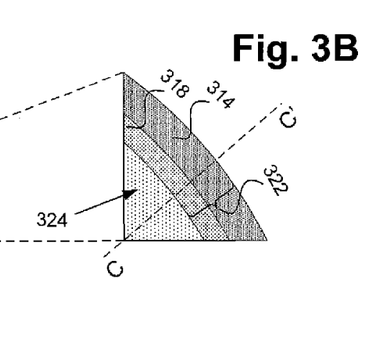
FIG. 3B illustrates a top plan view of a portion of a semiconductor wafer having one or more TSVs according to one implementation of the present application.

FIG. 3B presents a magnified top plan view of a region of an exemplary semiconductor wafer shown in FIG. 3A, according to an implementation of the present application. In particular, FIG. 3B illustrates a magnified top plan view of region 330 of semiconductor wafer 302 in FIG. 3A, where region 330 includes portions of stepped support ring 322 and usable back side region 324, for example.

Figure 3C:
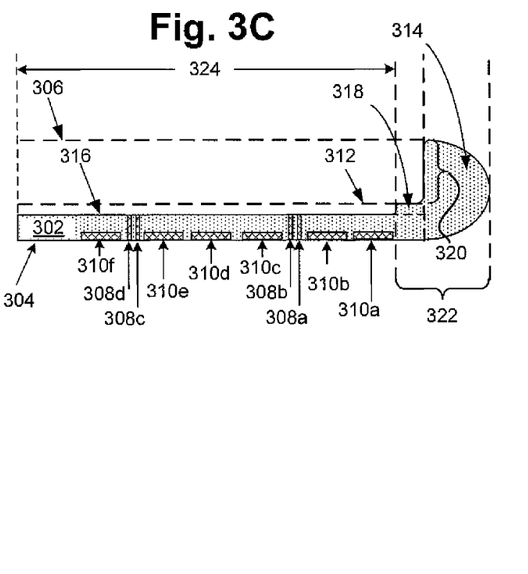
FIG. 3C illustrates a cross-sectional view of a portion of a semiconductor wafer having one or more TSVs according to one implementation of the present application.

FIG. 3C presents a cross-sectional view of a region of an exemplary semiconductor wafer, according to an implementation disclosed in the present application. In particular, FIG. 3C illustrates a cross-sectional view of region 330 of semiconductor structure 300 of FIG. 3A along the line C-C' shown in FIG. 3B. As illustrated in FIG. 3C, semiconductor wafer 302 includes front side 304 and back side 306. Devices 310*a*, 310*b*, 310*c*, 310*d*, 310*e*, and 310*f* (hereinafter collectively referred to as "devices 310*a* through 310*f*") are formed on front side 304 of semiconductor wafer 302. In an implementation, one or more devices 310*a* through 310*f* may include active semiconductor devices, such as CMOS devices, BiCMOS devices, BJTs and FETs. In another implementation, one or more devices 310*a* through 310*f* may include passive devices, such as resistors, capacitors and inductors. In yet another implementation, one or more devices 310*a* through 310*f* may include MEMS devices or any combination of MEMS devices, active semiconductor devices and passive devices.

As illustrated in FIG. 3C, TSVs 308*a*, 308*b*, 308*c* and 308*d* (hereinafter collectively referred to as "TSVs 308*a* through 308*d*") are also formed on front side 304 of semiconductor wafer 302 prior to a back side wafer process. One or more TSVs 308*a* through 308*d* may be utilized to provide electrical and/or thermal connections between one or more devices 310*a* through 310*f* and a back side metal (not explicitly shown in FIG. 3C) on back side 306 of semiconductor wafer 302 in any desired manner. In one implementation, one or more TSVs 308*a* through 308*d* may be through-silicon vias connected to a ground plate or patterns of oxide or metal interconnects on semiconductor wafer 302. In another implementation, one or more TSVs 308*a* through 308*d* may be isolated TSVs.

As further illustrated in FIG. 3C, semiconductor wafer 302 includes stepped support ring 322 on an outer edge thereof, where stepped support ring 322 substantially encloses usable back side region 324. Stepped support ring 322 includes step 320 between inner ring 318 and outer ring 314. Stepped support ring 322 provides mechanical strength to maintain the structural integrity of semiconductor wafer 302 during and after the formation of stepped support ring 322, such that, after the formation of outer ring 314, the wafer process can continue in most tools without the assistance of a temporarily bonded wafer. As such, semiconductor wafer 302 having stepped support ring 322 can be picked up and moved around by hand without using any special wafer handling and/or supporting tools.

In the present implementation, semiconductor wafer 302 may have a full thickness of approximately 725 μm and a diameter of approximately 200 mm, for example. Usable back side region 324, which may correspond to a thinned region of semiconductor wafer 302, may have a thickness of approximately 50 μm, 75 μm, 100 μm or 150 μm. A lateral distance between TSV 308*a* and device 310*b* may be approximately 5-10 μm.

The present inventive concepts utilize a stepped support ring having an inner ring and an outer ring to substantially enclose a usable back side region of a semiconductor wafer, where the outer ring of the stepped support ring is formed on an outer edge of the semiconductor wafer to provide mechanical strength to maintain the structural integrity of the semiconductor wafer during and after the wafer thinning process, and the inner ring of the stepped support ring provides a transition necessary to reduce the stress concentrated on the boundary between a usable back side region and the outer ring. The present inventive concepts also utilizes a two pass grinding process to first coarse grind and remove a portion of the semiconductor wafer from the back side, then fine grind the back side of the semiconductor wafer using a finer grinding wheel that is configured to stop the grinding upon reaching the TSVs to minimize mechanical damage to the wafer surface to provide an excellent surface for further processing. As such, a final polish action, such as CMP, wet etch or plasma etch, in conventional wafer processing methods can be avoided, thereby saving manufacture cost and time. The present inventive concepts can also allow higher temperature processing, prevent additional processes from contaminating the wafer surfaces, for example, during bonding and debonding processes, thereby further reducing manufacture cost and time.

As can be understood by a person of ordinary skill in the art that the processed wafer having TSVs can be diced and singulated into individual dies and thereafter packaged using various semiconductor packaging techniques and processes. As such, the present inventive concepts are manifestly applicable to fabricating semiconductor wafers and/or dies, which may or may not be later packaged, in accordance with the present disclosure described above.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method comprising:
forming at least one through substrate via (TSV) in said semiconductor wafer;
coarse grinding a back side of said semiconductor wafer to form an outer ring of a stepped support ring;
fine grinding said back side of said semiconductor wafer to form an inner ring of said stepped support ring, wherein said fine grinding exposes said at least one TSV and forms a usable back side region of said semiconductor wafer; and
forming a back side metal on said usable back side region of said semiconductor wafer without performing any polish action on said usable back side region of said semiconductor wafer.

2. The method of claim 1, wherein said fine grinding comprises detecting a change in grinding rate when reaching said at least one TSV.

3. The method of claim 1, further comprising stopping said fine grinding upon reaching said at least one TSV.

4. The method of claim 1, further comprising forming a plurality of semiconductor devices on a front side of said semiconductor wafer, wherein at least one of said plurality of semiconductor devices is coupled to the back side metal through said at least one TSV.

5. The method of claim 1, wherein a thickness between a front side and the usable back side region of said semiconductor wafer is equal to less than approximately 100 microns.

6. A method comprising:
forming at least one through substrate via (TSV) in said semiconductor wafer;
coarse grinding a back side of said semiconductor wafer to form an outer ring of a stepped support ring;
fine grinding said back side of said semiconductor wafer to form an inner ring of said stepped support ring, wherein said fine grinding exposes said at least one TSV, wherein said fine grinding comprises detecting a change in grinding rate when reaching said at least one TSV; and
stopping said fine grinding in response to detecting the change in the grinding rate.

7. The method of claim 6, further comprising forming a plurality of semiconductor devices on a front side of said semiconductor wafer.

8. The method of claim 7, wherein said fine grinding forms a usable back side region of said semiconductor wafer.

9. The method of claim 8, further comprising forming a back side metal on said usable back side region of said semiconductor wafer.

10. The method of claim 9, wherein at least one of said plurality of semiconductor devices is coupled to the back side metal on the usable back side region of said semiconductor wafer through said at least one TSV.

11. The method of claim 8, wherein a thickness between the front side and the usable back side region of said semiconductor wafer is equal to less than approximately 100 microns.

* * * * *